US012772852B2

(12) United States Patent
Wu

(10) Patent No.: US 12,772,852 B2
(45) Date of Patent: Oct. 20, 2026

(54) OPENING IN WALL BETWEEN INPUT/OUTPUT OPENINGS OF IC CHIP

(71) Applicant: GlobalFoundries U.S. Inc., Malta, NY (US)

(72) Inventor: Zhuojie Wu, Port Chester, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 586 days.

(21) Appl. No.: 18/181,123

(22) Filed: Mar. 9, 2023

(65) Prior Publication Data

US 2024/0304570 A1 Sep. 12, 2024

(51) Int. Cl.
*H10W 74/01* (2026.01)
*H10W 42/00* (2026.01)

(52) U.S. Cl.
CPC ........... *H10W 42/00* (2026.01); *H10W 74/01* (2026.01)

(58) Field of Classification Search
CPC ....... H01L 23/562–576; H01L 21/3205; H01L 21/56; H10W 42/00; H10W 74/01
See application file for complete search history.

(56) References Cited

U.S. PATENT DOCUMENTS 7,564,387 B1 * 7/2009 Vawter ...................... G02F 7/00 341/137
8,530,997 B1 * 9/2013 Yang ....................... H01L 23/58 438/618
10,770,412 B2 9/2020 Polomoff et al.
11,145,606 B1 10/2021 Polomoff et al.
2004/0150073 A1 8/2004 Matumoto et al.
2006/0006493 A1 1/2006 Kawano et al.
2006/0055005 A1 3/2006 Furusawa et al.
2017/0345773 A1 11/2017 Baek et al.
2020/0035620 A1 1/2020 Yang et al.
2021/0183791 A1 6/2021 Sahin et al.
2021/0305172 A1 9/2021 Polomoff et al.
(Continued)

FOREIGN PATENT DOCUMENTS

KR 20020026995 A 4/2002

OTHER PUBLICATIONS

Barwicz et al., "Integrated Metamaterial Interfaces for Self-Aligned Fiber-to-Chip Coupling in Volume Manufacturing," IEEE Journal of Selected Topics in Quantaum Electronics, 25:4700313, May/Jun. 2019 (13 pages).
(Continued)

*Primary Examiner* — Zandra V Smith
*Assistant Examiner* — Daniel J Hibbert
(74) *Attorney, Agent, or Firm* — Francois Pagette; Hoffman Warnick LLC

(57) ABSTRACT

A structure includes an integrated circuit (IC) chip including a substrate. At least two input/output (I/O) openings extend inwardly from an exterior surface of the IC chip. The I/O openings can be used to connect any sort of I/O device, such as an external optical device like a laser. Each I/O opening is separated from an adjacent I/O opening by a wall. An opening extends through the wall to each of the at least two I/O openings, and a moisture barrier is on inner surfaces of each I/O opening and the opening. The opening may reduce stress and may reduce sharp corners in the I/O openings to reduce damage to the moisture barrier.

20 Claims, 11 Drawing Sheets

(56) References Cited

U.S. PATENT DOCUMENTS

2022/0291464 A1 9/2022 Polomoff et al.

OTHER PUBLICATIONS

Cho et al., "Optical performance and reliability assessment from self-aligned single mode fiber attach for O-band silicon photonics platform," 2022 IEEE 72nd Electronic Components and Technology Conference (ECTC), 2022 IEEE, pp. 403-409 (7 pages).
Peng et al., "A CMOS Compatible Monolithic Fiber Attach Solution with Reliable Performance and Self-Alignment," Th31.4.pdf, OFC 2020, OSA 2020 (4 pages).
Wu et al., "Chip-Package Interaction Challenges for Large Die Applications," 2018 IEEE 68th Electronic Components and Technology Conference (ECTC), 2018 IEEE, pp. 656-662 (7 pages).
Wu et al., "CPI Reliability Challenges of Large Flip Chip Packages and Effects of Kerf Size and Substrate," 978-1-5386-9504-3/19, 2019 IEEE (7 pages).
U.S. Appl. No. 18/154,143, entitled "Structure Including Moisture Barrier Along Input/Output Opening and Related Method," filed Jan. 13, 2023, 31 pages.
U.S. Appl. No. 18/154,143, Office Action dated Jul. 24, 2025, 14 pages.
European Search Report for corresponding EP Application No. 23195594.9-1212 dated Feb. 5, 2024, 11 pages.
U.S. Appl. No. 18/154,143, Final Office Action dated Feb. 5, 2026, 16 pages.
U.S. Appl. No. 18/154,143, Amendment to Office Action filed Oct. 23, 2025, 12 pages.

* cited by examiner

OPENING IN WALL BETWEEN INPUT/OUTPUT OPENINGS OF IC CHIP

BACKGROUND

The present disclosure relates to integrated circuits and, more particularly, to a structure including an opening in a wall between adjacent input/output openings.

Integrated circuit (IC) chips can fail or be damaged when moisture enters the structure, e.g., within a guard ring. Photonics integrated circuit (PIC) chips are especially prone to moisture ingress due to input/output openings in their guard ring used, for example, to connect to external photonics components. Moisture barriers, such as a thin dielectric layer of silicon nitride (SiN), are used around the chip periphery and the input/output openings. IC chips with multiple input/output openings present a heightened risk of moisture ingress. For example, the presence of multiple input/output openings creates internal corners that can cause higher stress and cracks, leading to moisture ingress.

SUMMARY

All aspects, examples and features mentioned below can be combined in any technically possible way.

An aspect of the disclosure provides a structure, comprising: an integrated circuit (IC) chip including a substrate; at least two input/output (I/O) openings extending inwardly from an exterior surface of the IC chip, each I/O opening separated from an adjacent I/O opening by a wall; an opening extending through the wall to each of the at least two I/O openings; and a moisture barrier on inner surfaces of each I/O opening and the opening.

An aspect of the disclosure provides a structure, comprising: an integrated circuit (IC) chip including a substrate; a first input/output (I/O) opening extending inwardly from an exterior surface of the IC chip; a second I/O opening extending inwardly from the exterior surface of IC chip and adjacent the first I/O opening, the first I/O opening separated from the second I/O opening by a wall; an opening extending through the wall to the first I/O opening and the second I/O opening; and a moisture barrier on inner surfaces of the first I/O opening, the second I/O opening and the opening.

An aspect of the disclosure provides a method, comprising: forming an integrated circuit (IC) chip including a substrate; forming at least two input/output (I/O) openings extending inwardly from an exterior surface of the IC chip, each I/O opening separated from an adjacent I/O opening by a wall having an opening extending through the wall to each of the at least two I/O openings; and forming a moisture barrier on inner surfaces of each I/O opening and the opening.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
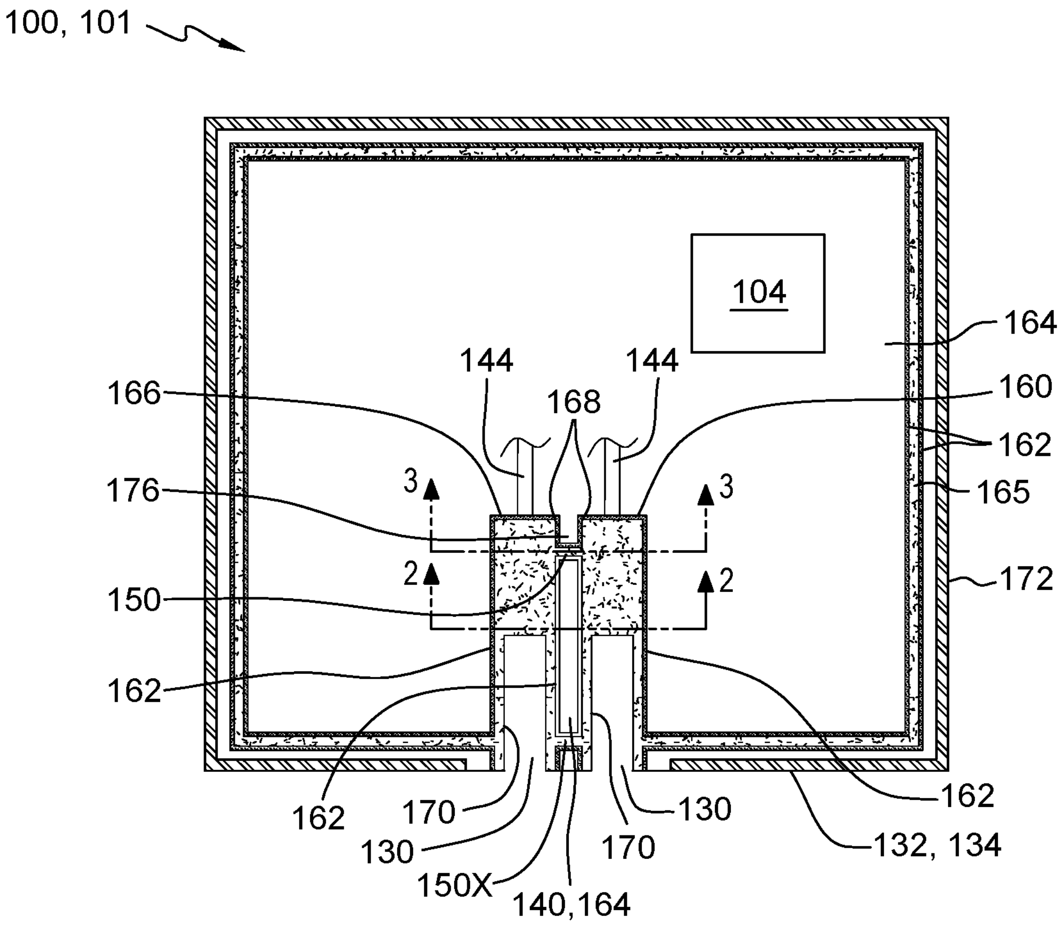
FIG. 1 shows a schematic top-down view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which are shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including an integrated circuit (IC) chip including a substrate. At least two input/output (I/O) openings extend inwardly from an exterior surface of the IC chip. The I/O openings can be used to connect any sort of I/O device, such as an external optical device like a laser. Each I/O opening is separated from an adjacent I/O opening by a wall. An opening extends through the wall to each of the at least two I/O openings, and a moisture barrier is on inner surfaces of each I/O opening and the opening. The opening can be used to remove sharp corners in the I/O openings and/or otherwise reduce stress, such as film stresses, to reduce damage to the moisture barrier.

Figure 2:
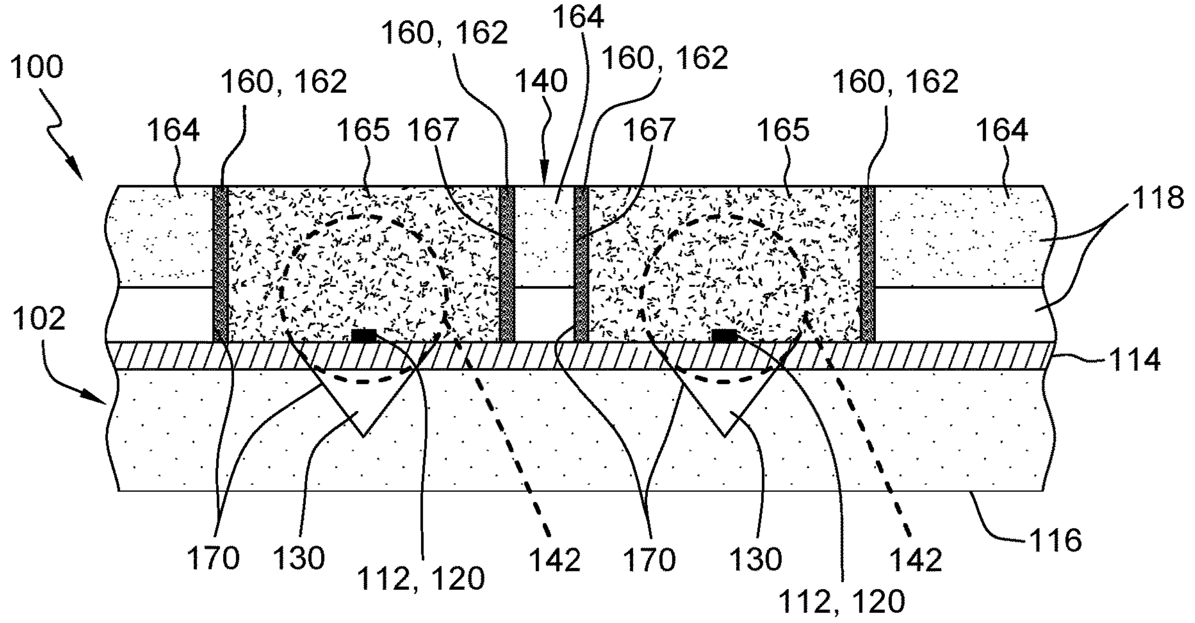
FIG. 2 shows a cross-sectional view of a structure and IC chip along view line 2-2 in FIG. 1.
Figure 3:
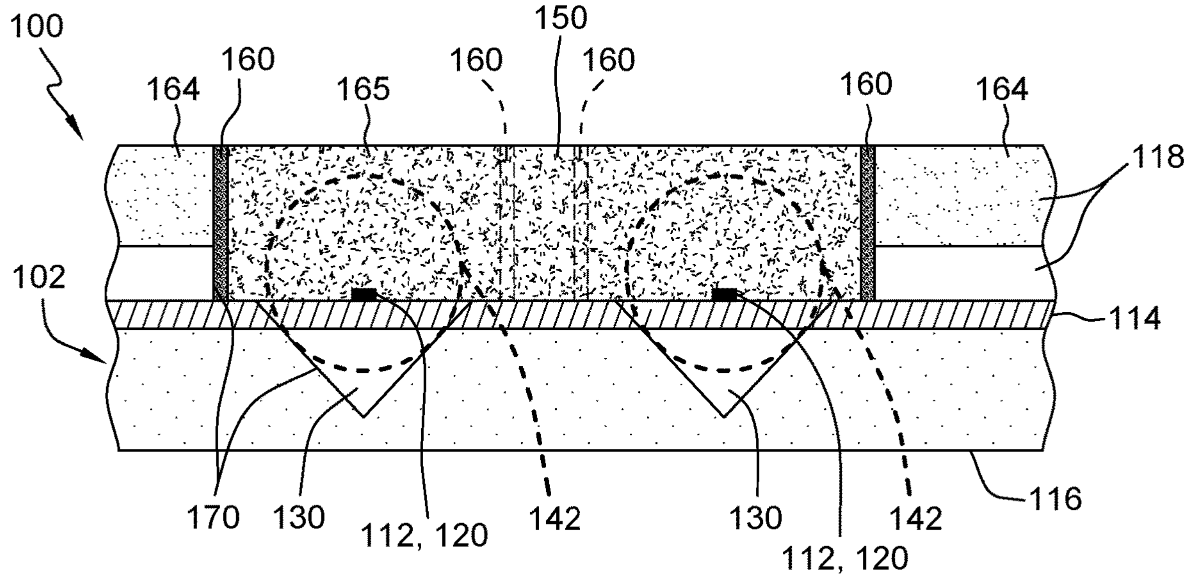
FIG. 3 shows a cross-sectional view of a structure and IC chip along view line 3-3 in FIG. 1.
Figure 4:
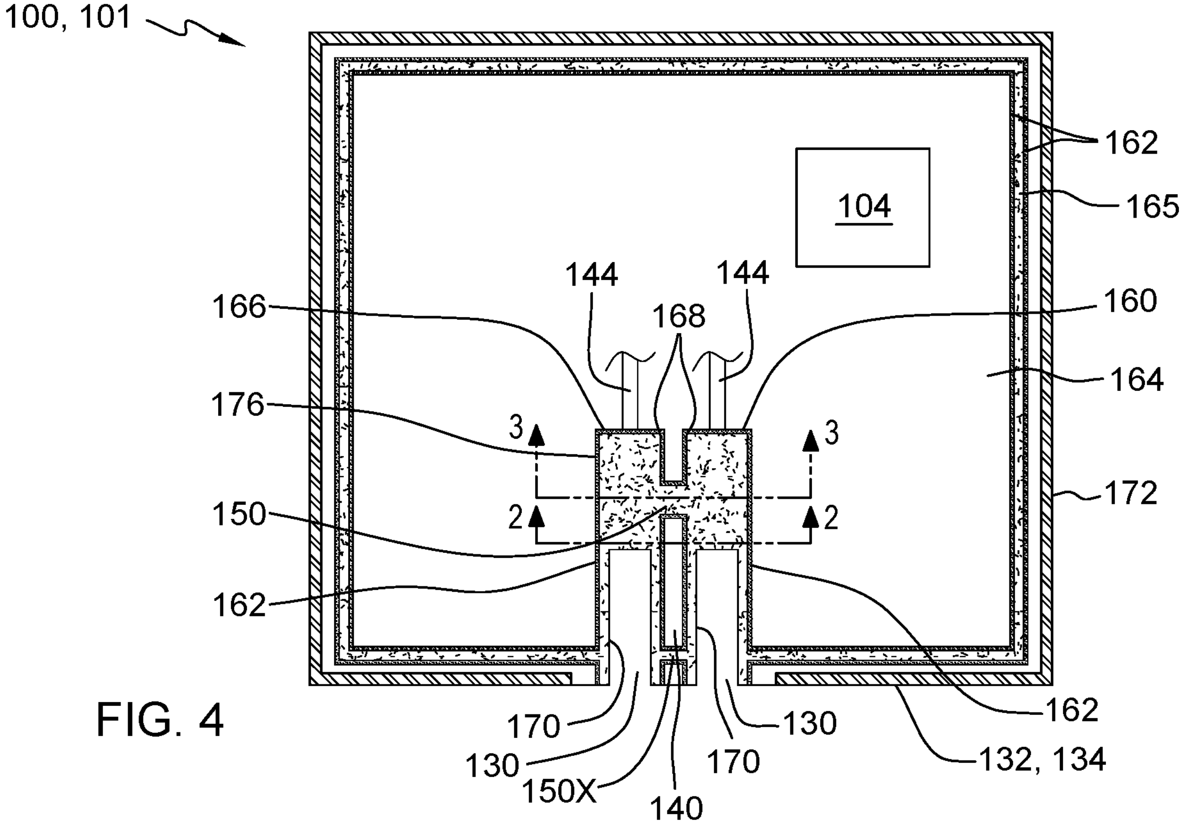
FIG. 4 shows a schematic top-down view of a structure and IC chip according to embodiments of the disclosure.

FIG. 1 shows a perspective view of a structure 100, FIG. 1 shows a schematic top-down view of structure 100, FIG. 2 shows a cross-sectional view along view line 2-2 in FIG. 1, and FIG. 3 shows a cross-sectional view along view line 3-3 in FIG. 1, according to embodiments of the disclosure. (Note, in the cross-sectional views in FIGS. 2 and 3, a dielectric layer 164 is shown with shading; however, in the top-down drawings herein, e.g., FIG. 1, dielectric layer 164 is shown white for clarity purposes).

Structure 100 includes an integrated circuit (IC) chip 101 including a substrate 102. Substrate 102 can be broadly defined to include a semiconductor substrate upon which active circuitry 104 (FIG. 1 only) and other structures are formed. Other structures may include but are not limited to: middle-of-line (MOL) and/or back-end-of-line (BEOL) interconnects that electrically interconnect active circuitry 104 and/or photonic components, and/or related packaging layers over BEOL interconnects. Substrate 102 can be in the form of, for example, a bulk semiconductor or a semiconductor-on-insulator (SOI) substrate (latter shown). In one non-limiting example, as shown in FIGS. 2 and 3, where an SOI substrate is used, substrate 102 may include a semiconductor-on-insulator (SOI) layer 112 over a buried insulator layer 114 over a base semiconductor layer 116. SOI layer 112 and base semiconductor layer 116 may include silicon, silicon germanium or other semiconductor materials. Buried insulator layer 114 may include any appropriate dielectric such as but not limited to silicon dioxide. As also shown in FIGS. 2 and 3, various MOL and/or BEOL interconnect layers 118 that electrically interconnect active circuitry 104 and/or photonic components may be provided over substrate 102.

Structure 100 may include any now known or later developed integrated circuit or photonics integrated circuit including any variety of active circuitry 104 that may experience moisture ingress. Active circuitry 104 can include any form of circuity including but not limited to: logic, memory, and/or photonics. Moisture ingress into structure 100 and active circuitry 104 can damage the physical structure of, for example, active circuitry 104, interconnect layers, photonics, etc.

With continuing reference to FIGS. 1-3, for purposes of description, structure 100 and, in particular, IC chip 101 is illustrated as a photonics integrated circuit (PIC) chip. For example, in FIGS. 2 and 3, SOI layer 112 is shown to include silicon edge couplers 120 which may couple to, for example, internal optical waveguides 144 (see e.g., FIG. 1). A center of an external component 142, e.g., an optical fiber, may be offset from silicon edge coupler 120, as shown in FIGS. 2 and 3. For example, the center of an optical fiber may be about 0.8-1 micrometers (μ m) above silicon edge coupler 120, or the center of the optical fiber may be aligned with silicon edge coupler 120, e.g., with zero offset. It will be recognized that other structure(s), such as a silicon nitride edge coupler (not shown) above silicon edge coupler 120, may also be present to assist in coupling light from the optical fiber to an internal optical waveguide 144 on IC chip 101. (It is recognized by those with skill in the art that SOI layer 112 may also be used for a wide variety of other devices, such as transistors of active circuitry 104. Further, optical waveguides, such as silicon nitride waveguides, can be provided in other layers of structure 100 and IC chip 101.) Certain IC structures and many PIC structures present a heightened risk of moisture ingress because they include at least two input/output (I/O) openings 130 that present moisture ingress paths through which moisture can pass through moisture barrier 160. Structure 100 includes at least two I/O openings 130 extending inwardly from an exterior surface 132 of IC chip 101. In FIGS. 1-3, exterior surface 132 of IC chip 101 includes an edge 134 of IC chip 101. As shown in FIGS. 1-2, each I/O opening 130 is separated from an adjacent I/O opening 130 by a wall 140, e.g., including one or more interlayer dielectric (ILD) layers of interconnect layers 118. I/O openings 130 are provided to allow connection of external components 142 (FIGS. 1-2 only for clarity), such as external photonics components or external electronic components. For purposes that will be further described herein, structure 100 also includes an opening 150 extending through wall(s) 140 to each of the at least two I/O openings 130.

External components 142 in the form of electrical devices in I/O openings 130 can take any now known or later developed form. External components 142 in the form of optical components in I/O openings 130 can take any now known or later developed form such as but not limited to: an optical fiber; an external optical component such as a laser; an optical waveguide of, for example, silicon, silicon nitride, aluminum nitride, polymer, metamaterial etc. In the latter case, structure 100 may include an external photonics component (labeled 142) adjacent I/O opening 130. External photonics components(s) may be coupled to, for example, internal optical waveguides 144 (FIG. 1 only) that are optically coupled to active circuitry 104 in a known fashion. I/O opening(s) 130 can take any now known or later developed form such as but not limited to: V-groove(s), U-grooves, inverse taper, trident, or any other trench groove, etc. While described relative to a PIC chip, it will be recognized that the teachings of the disclosure are applicable to any IC chip having adjacent I/O openings 130 separated by respective walls 140.

To prevent moisture ingress, structure 100 includes a moisture barrier 160 surrounding active circuitry 104. As shown in FIGS. 1 and 2, moisture barrier 160 is on inner surfaces of each I/O opening 130. More particularly, moisture barrier 160 may be on inner endwalls 166 and opposing axial sidewalls 170 of I/O openings 130. That is, as shown in FIG. 2, moisture barrier 160 is on vertical sidewall surfaces 167 of wall 140. Moisture barrier 160 may also be on inner surfaces of openings 150. Moisture barrier 160 may include any now known or later developed barrier configured to resist, and ideally prevent, moisture ingress. Moisture barrier 160 may include one or more layers of dielectric. For example, moisture barrier 160 may include but is not limited to one or more elongated members of dielectric positioned in one or more ILDs of interconnect layers 118 (FIGS. 2-3). In one non-limiting example, shown in FIGS. 2 and 3, moisture barrier 160 may include one or more silicon nitride or other moisture impervious dielectric material elements 162 surrounded by a dielectric layer 164, e.g., an interlayer dielectric such as a low dielectric constant material. In some areas, moisture barrier 160 includes a silicon nitride or other moisture impervious dielectric material element 162 on an inner surface of I/O openings 130 and wall 140. In other areas, moisture barrier 160 includes a pair of silicon nitride or other moisture impervious dielectric material elements 162 separated by dielectric layer 165, e.g., a silicon oxide. Moisture barrier 160 may have the latter format, for example, as it extends around an entirety of IC chip 101, i.e., outside of I/O openings 130. Hence, in certain embodiments, moisture barrier 160 may include one or more silicon nitride layers. Further, each I/O opening 130 and each opening 150 may include dielectric layer 165, e.g., a silicon oxide, therein. Other forms of moisture barrier 160 are also possible.

Moisture barrier 160 can be formed using any now known or later developed semiconductor fabrication techniques. As understood in the field, in some cases, moisture barrier 160 may also provide guard ring functionality. However, in certain embodiments, moisture barrier 160 may be used with a primary guard ring (not shown, but within moisture barrier 160). A guard ring may include any now known or later developed layered conductive elements coupled to ground to electrically isolate active circuitry 104 and other components of structure 100 from, among other things, electrical interference. In certain embodiments, structure 100 may also include one or more crack stops 172 (see e.g., FIG. 1) that is within and/or surrounds (shown) moisture barrier 160 to prevent cracking and/or unwanted stress in the chip or in moisture barrier 160 that could lead to moisture ingress. Crack stop(s) 172 may include any now known or later developed layered conductive elements. Guard rings and crack stop 172 can be in any MOL and/or BEOL interconnect layers 118 and can be formed using any now known or later developed semiconductor fabrication techniques.

Moisture barriers 160 are subject to damage where inner endwalls 166 thereof form inner corners 168 (FIG. 1 only) with opposing axial sidewalls 170 of I/O openings 130 or other surfaces. More particularly, corners 168 present areas of increased film stress susceptible to cracks or other damage to moisture barrier 160. The damage can lead to a heightened risk of moisture ingress. Crack stops 172 are also used around an IC chip to prevent cracks from propagating through a chip, but do not adequately address this type damage to moisture barriers 160. Guard rings (not shown) may be present within moisture barrier 160, but also do not adequately address this type of damage to moisture barrier 160.

Embodiments of the disclosure provide mechanisms to reduce and/or eliminate damage to moisture barriers 160 at, for example, corners 168. In embodiments of the disclosure, wall 140 may be modified to protect against damage. More particularly, structure 100 may include opening 150 in wall 140, which may reduce stress in corners 168. Opening 150 extends to each adjacent I/O opening 130 of a respective wall 140, e.g., until filled with a dielectric in later processing, fluidly coupling I/O openings 130 through wall 140. Hence, opening 150 links I/O openings 130, i.e., it is a trench link. Opening 150 may be formed using any now known or later developed semiconductor fabrication techniques. In certain embodiments, openings 150 may be formed during formation of I/O openings 130, e.g., using a mask and etching underlying layers. Moisture barrier 160 may be formed after formation of openings 150 and I/O openings 130. Consequently, as shown in FIG. 1, moisture barrier 160 may be on inner surfaces of I/O openings 130 and openings 150, i.e., on inner endwalls 166, opposing axial sidewalls 170 and in openings 150. Opening(s) 150 can have any cross-sectional shape, e.g., circular, oblong, rectangular, etc., to, for example, relieve any desired stress. Opening(s) 150 can also have any size to, for example, relieve any desired stress. Any number of openings 150 can be used within a given wall 140 between adjacent I/O openings 130 to, for example, relieve any desired stress.

Opening 150 can take a variety of lateral arrangements to, for example, relieve stress on moisture barrier 160. FIGS. 1, 4-16 show various arrangements of I/O openings 130, walls 140 and openings 150. Although shown as discrete embodiments, the various arrangements illustrated can be intermixed in any manner.

In certain embodiments, for example as shown in FIGS. 1 and 4-12, I/O openings 130 include aligned inner endwalls 166. That is, inner endwalls 166 are in the same or nearly the same vertical plane. In FIGS. 1, 4-6, opening 150 extends through wall 140 at a distance from inner endwalls 166 of I/O openings 130. In this case, a portion 176 of wall 140 remains between inner endwalls 166. As observed by comparing FIGS. 1 and 4, the distance of opening 150 from endwalls 166 can be different in different embodiments. Opening 150 in FIG. 1 is closer to endwalls 166 than in FIG. 4.

Figure 5:
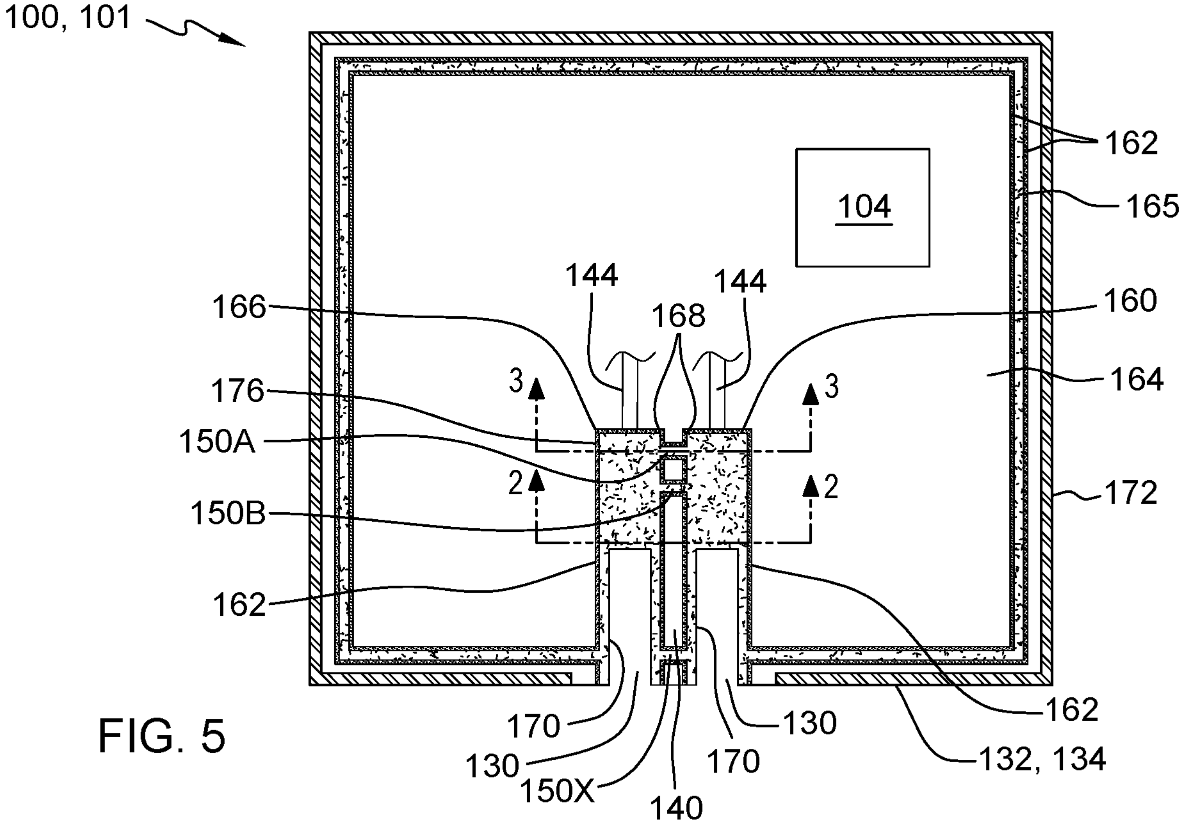
FIG. 5 shows a schematic top-down view of a structure and IC chip according to embodiments of the disclosure.
Figure 6:
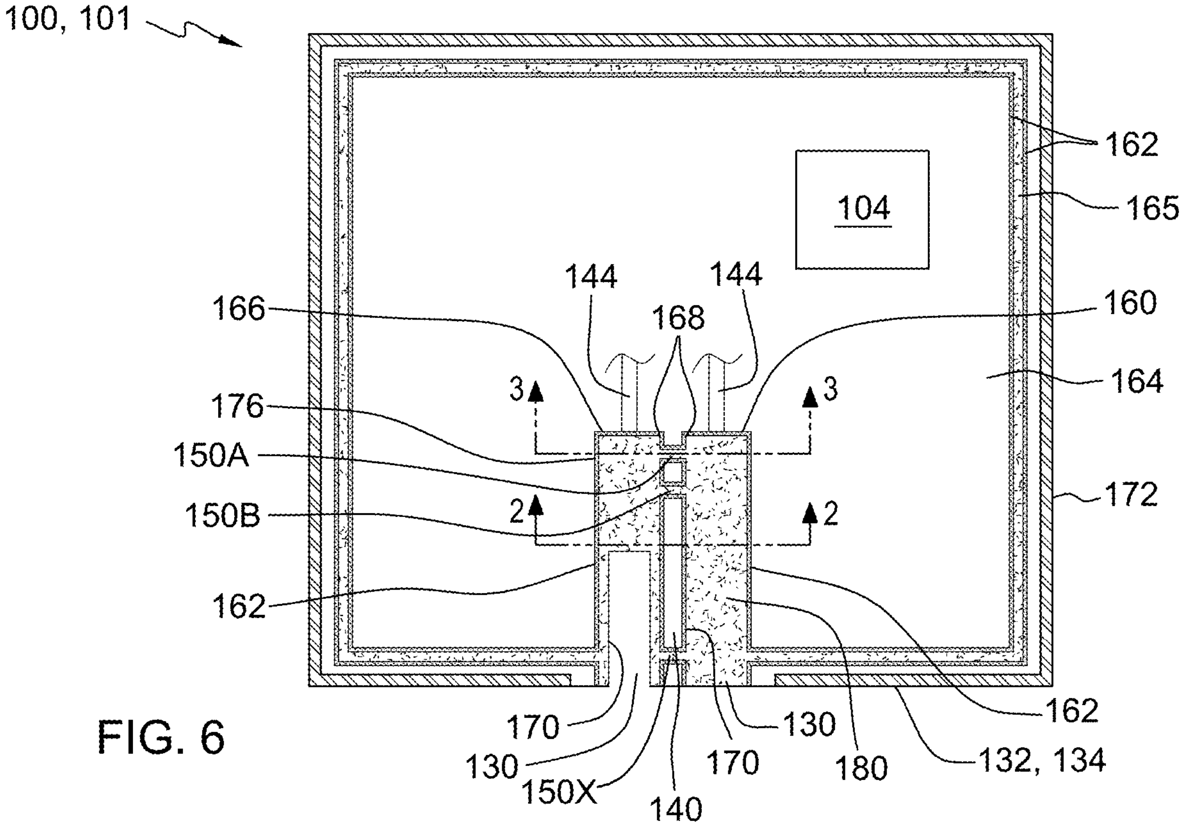
FIG. 6 shows a schematic top-down view of a structure and IC chip according to embodiments of the disclosure.

FIGS. 5 and 6 show schematic top-down views of embodiments of structure 100, similar to FIG. 1, but including multiple openings 150 in wall 140. In FIGS. 5 and 6, two openings 150A, 150B are in wall 140 between I/O openings 130. Each opening 150A, 150B is spaced within wall 140 from an adjacent opening. FIG. 6 also shows that one or more I/O openings 130 may be filled with a dielectric 180, e.g., an oxide, where no external component 142 (FIG. 1) will be positioned in the respective I/O opening 130.

Figure 7:
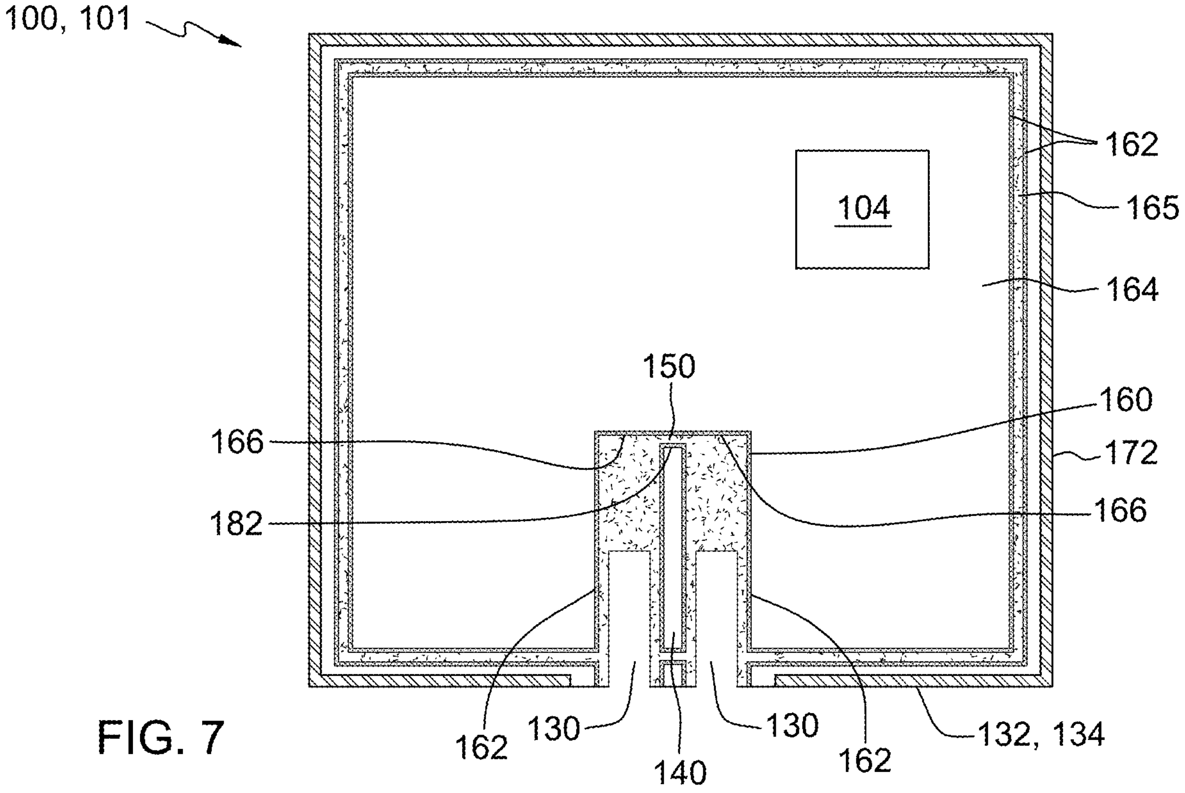
FIG. 7 shows a schematic top-down view of a structure and IC chip according to embodiments of the disclosure.
Figure 8:
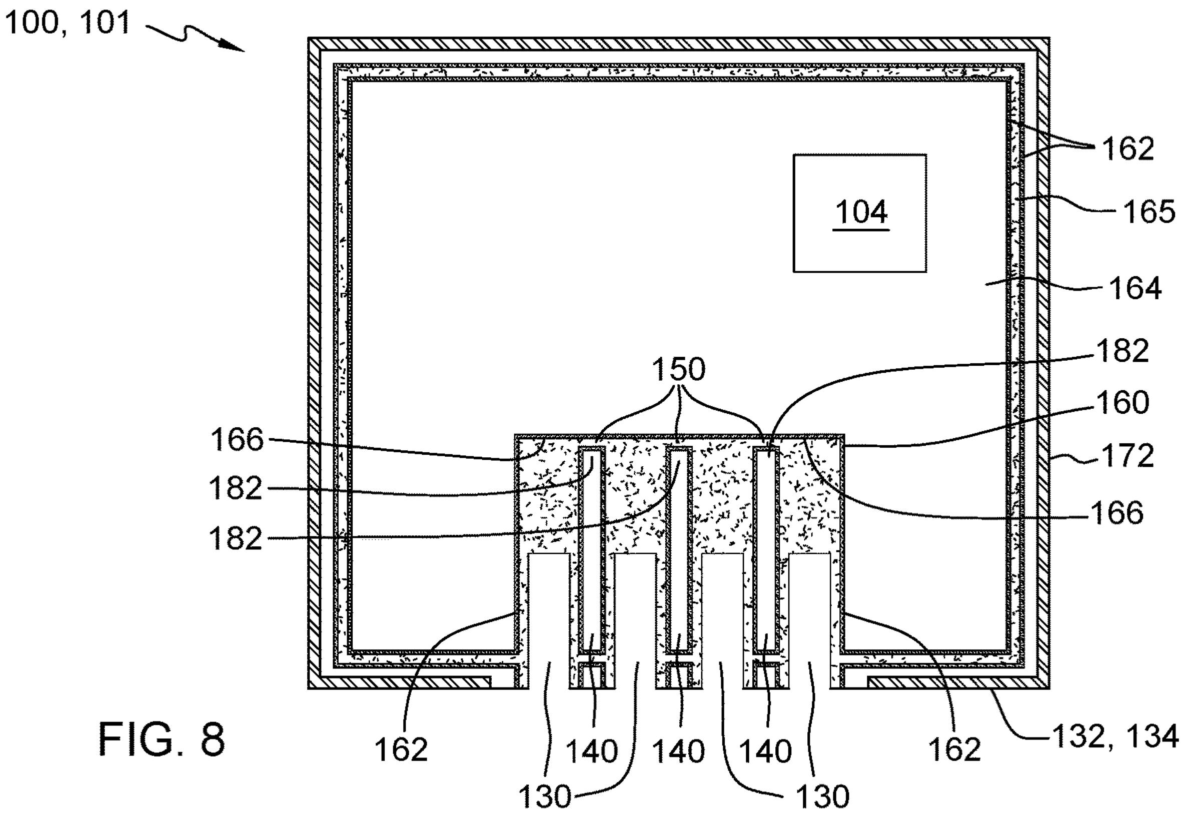
FIG. 8 shows a schematic top-down view of a structure and IC chip according to embodiments of the disclosure.

FIGS. 7-10 show schematic top-down views of other embodiments of structure 100. As in earlier embodiments, I/O openings 130 include aligned inner endwalls 166. That is, inner endwalls 166 are in the same or nearly the same vertical plane. In these embodiments, opening 150 extends through wall 140 such that inner endwalls 166 of each I/O opening 130 are contiguous, i.e., wall 140 does not separate inner endwalls 166. Here, an inner end 182 of wall 140 is distanced from inner endwalls 166. In FIG. 7, where two I/O openings 130 are present, opening 150 removes two corners from structure 100, i.e., one from each side of wall 140 in I/O openings 130 where wall 140 meets respective endwalls 166. Additional corners at the bottom of I/O openings 130 may also be removed. Where more I/O openings 130 are present, more corners can be removed to, for example, reduce stress. In FIG. 8, for example, where four I/O openings 130 are present, opening 150 removes six corners from structure 100, i.e., one from each side of wall 140 in I/O openings 130 where wall 140 meets respective endwalls 166. Additional corners at the bottom of I/O openings 130 may also be removed.

Figure 9:
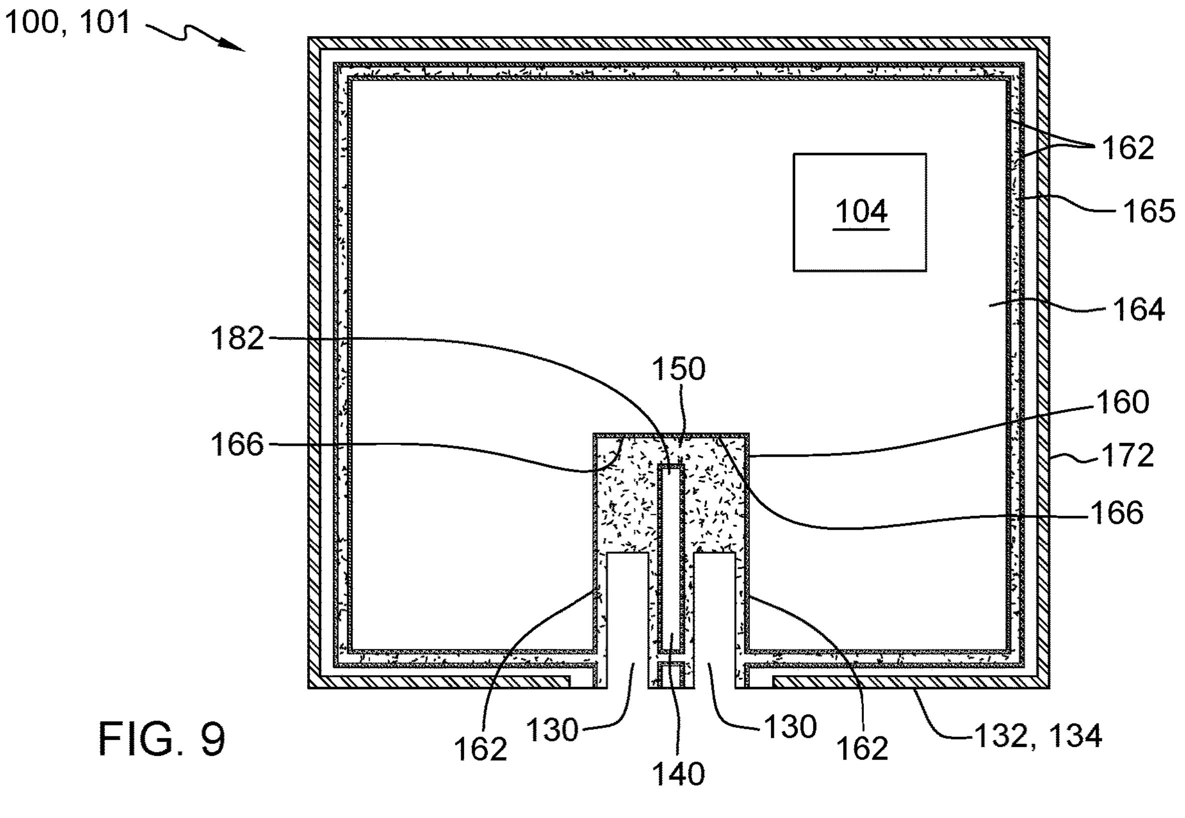
FIG. 9 shows a schematic top-down view of a structure and IC chip according to embodiments of the disclosure.
Figure 10:
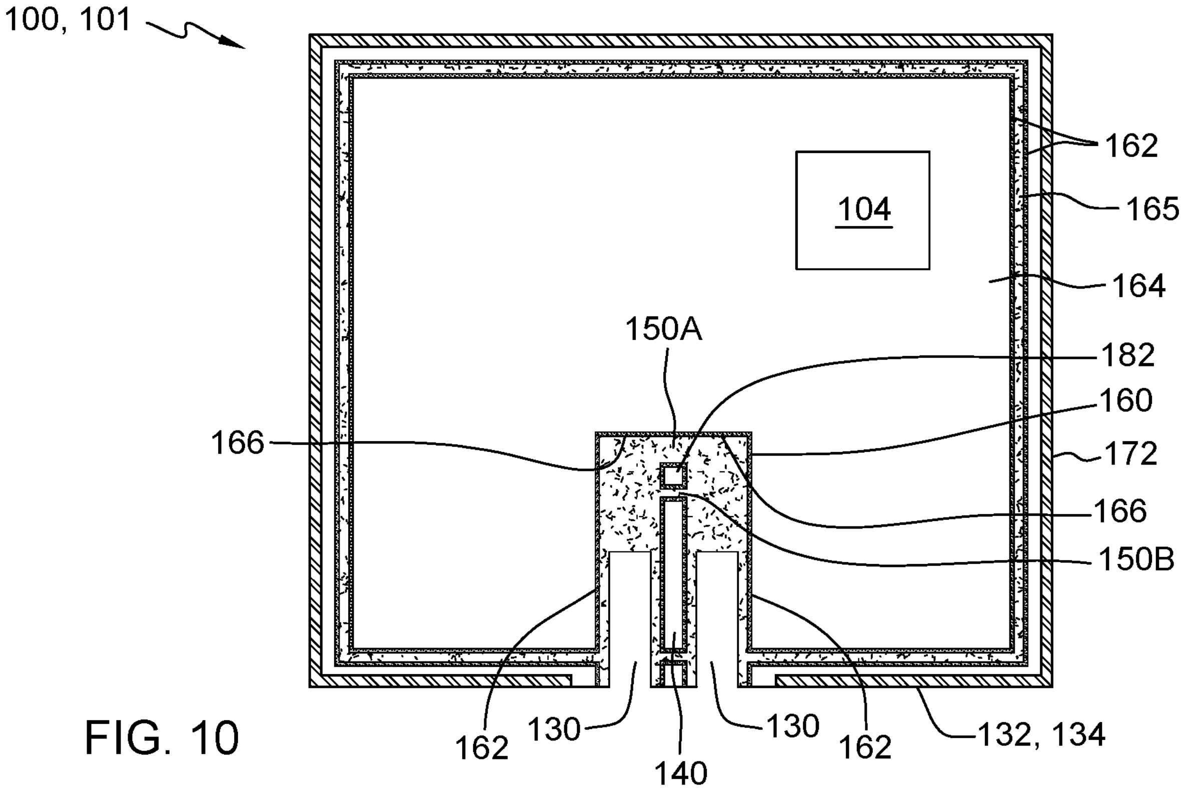
FIG. 10 shows a schematic top-down view of a structure and IC chip according to embodiments of the disclosure.

As observed by comparing FIGS. 7 and 9, a size of opening 150 that controls a distance of inner end 182 of wall 140 from endwalls 166 can be different. Opening 150 in FIG. 7 is smaller than in FIG. 9, making inner end 182 closer to endwalls 166 in FIG. 7 than in FIG. 9. FIG. 10 shows an embodiment similar to that of FIG. 9, but with two openings 150A, 150B in wall 140.

Figure 11:
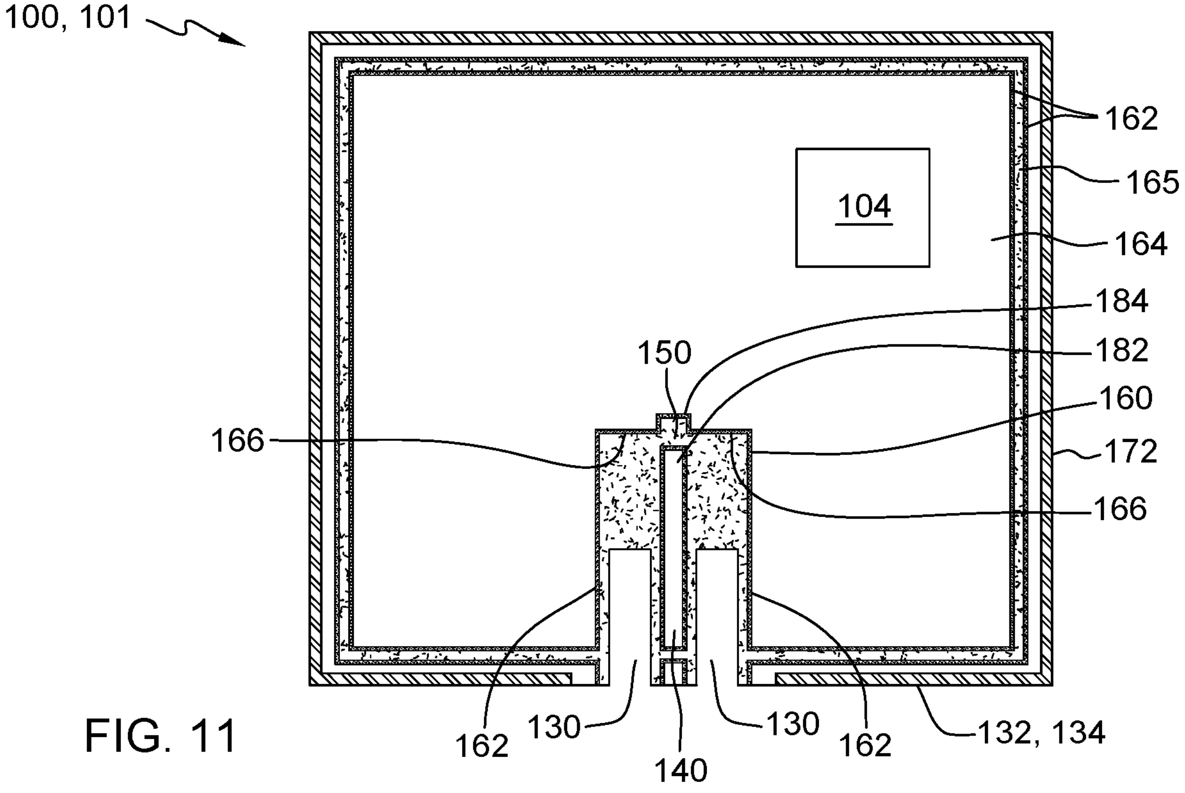
FIG. 11 shows a schematic top-down view of a structure and IC chip according to embodiments of the disclosure.

FIG. 11 shows an embodiment similar to FIGS. 7 and 9, but further including a recessed surface 184 extending inwardly away from wall 140 between inner endwalls 166 of each I/O opening 130. Recessed surface 184 may reduce stresses.

Figure 12:
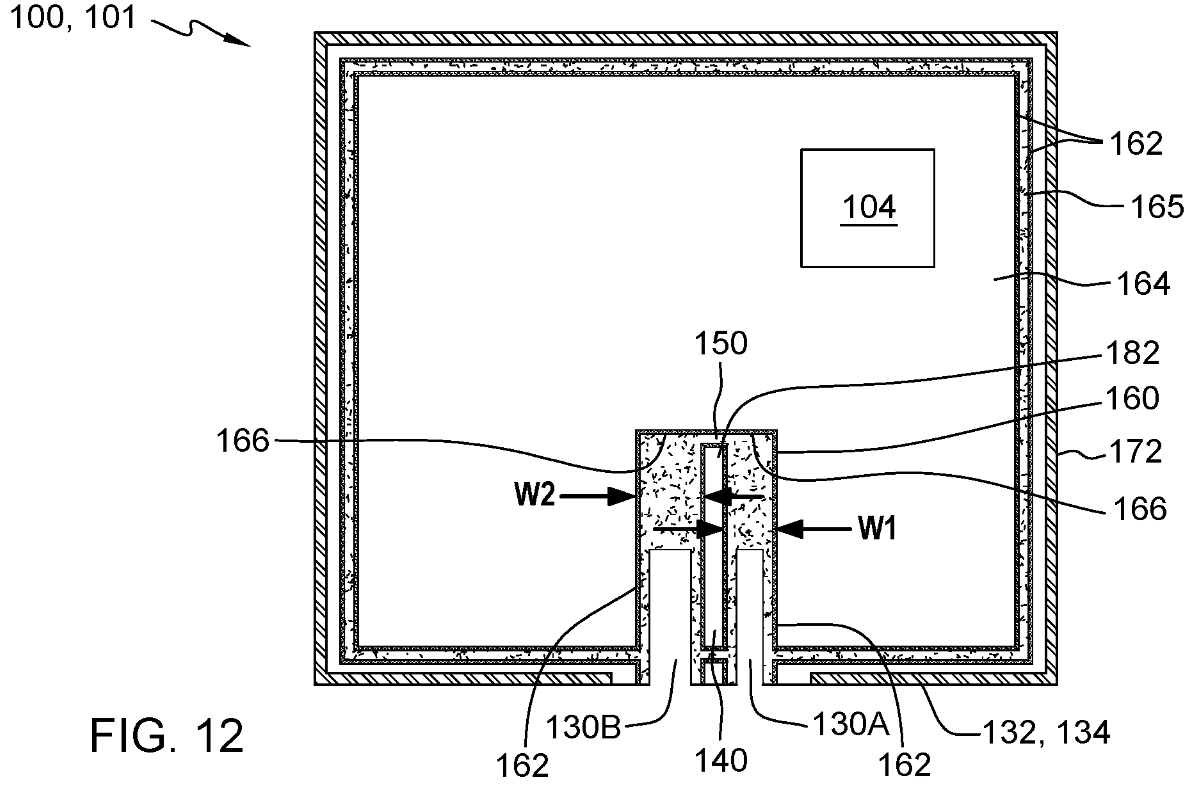
FIG. 12 shows a schematic top-down view of a structure and IC chip according to embodiments of the disclosure.

I/O openings 130 can also have different configurations that can be addressed by using opening(s) 150 in wall(s) 140. FIG. 12 shows an embodiment similar to FIG. 7 but illustrating that I/O openings 130 can have different widths. In this non-limiting example, I/O opening 130A has a width W1 that is smaller than a width W2 of I/O opening 130B. Other dimensions, e.g., height, can also be different.

Figure 13:
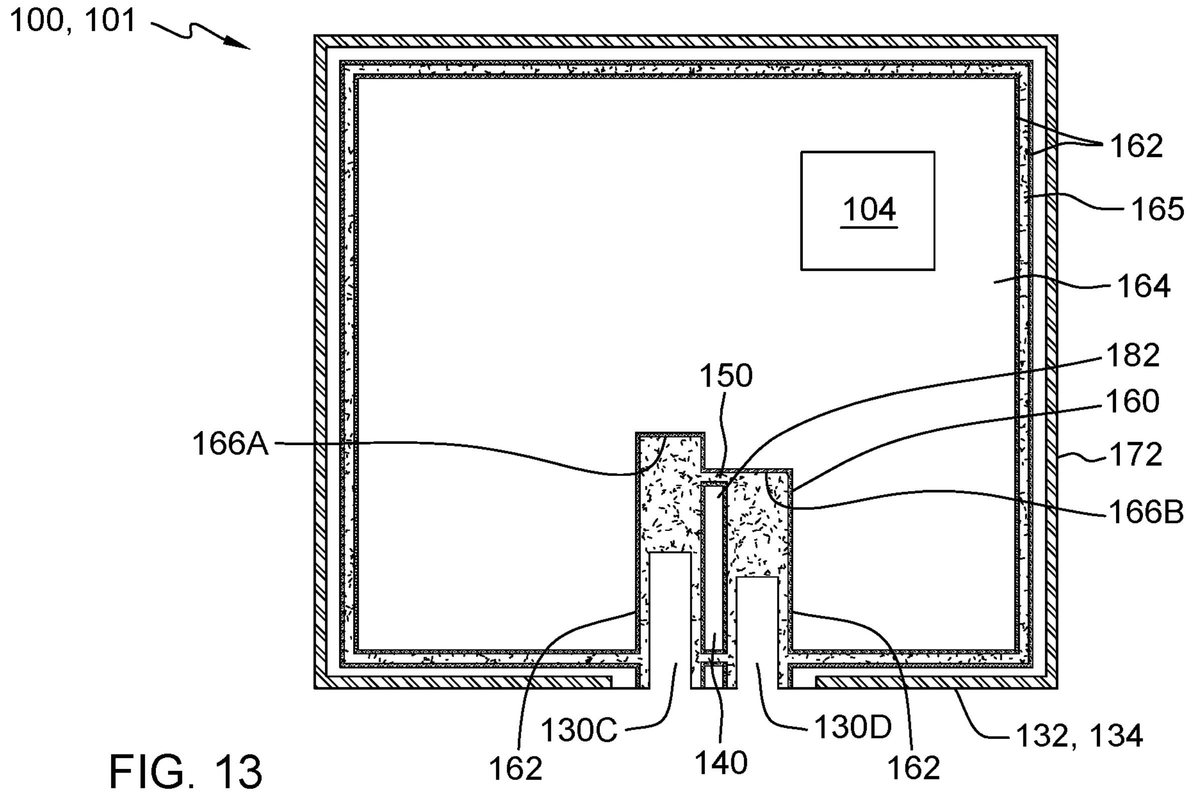
FIG. 13 shows a schematic top-down view of a structure and IC chip according to embodiments of the disclosure.
Figure 14:
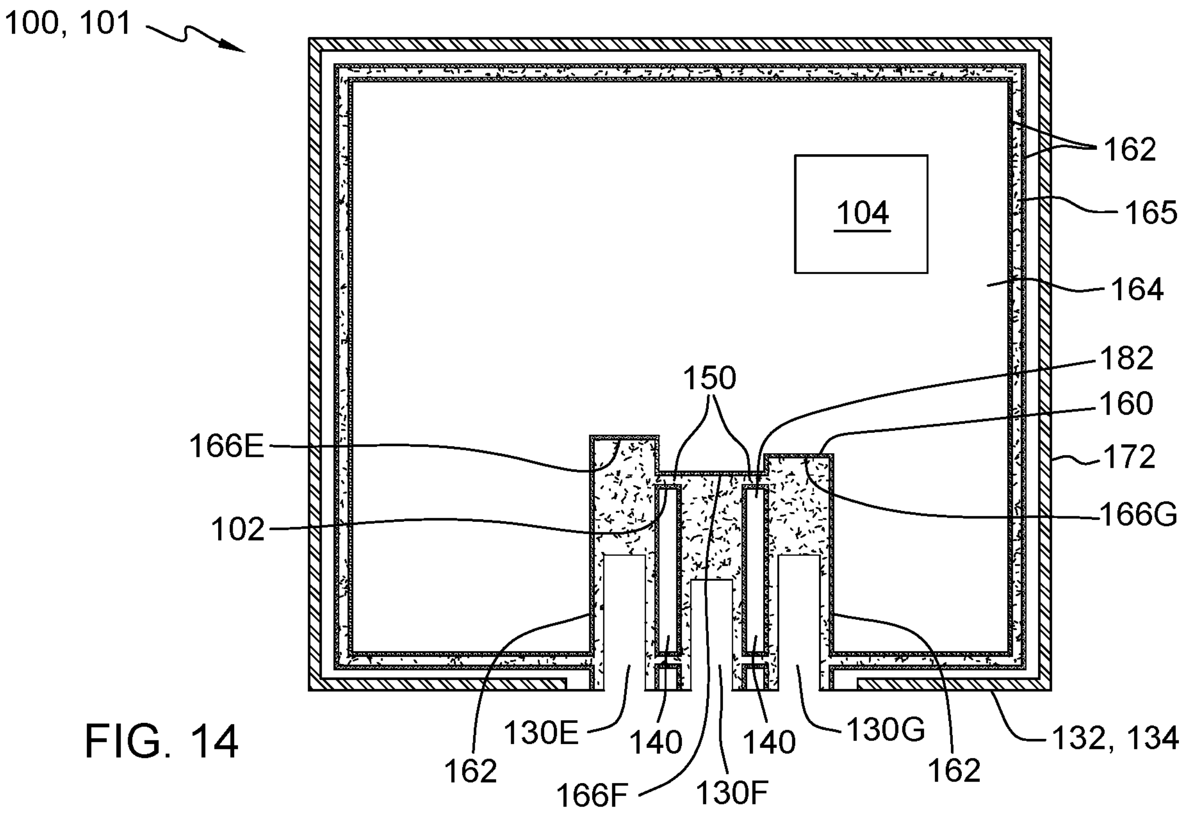
FIG. 14 shows a schematic top-down view of a structure and IC chip according to embodiments of the disclosure.

I/O openings 130 can also have different lengths, e.g., as they extend from exterior surface 132 of IC chip 101. Here, I/O openings 130 may include respective inner endwalls 166 arranged such that at least two of the inner endwalls 166 are not aligned. In FIG. 13, I/O opening 130A extends farther into IC chip 101 than adjacent I/O opening 130B such that inner endwall 166A of I/O opening 130A and inner endwall 166B of I/O opening 130B are not aligned. That is, inner endwalls 166A, 166B are not in the same vertical plane. FIG. 14 shows a similar arrangement in which three I/O openings 130E-G are present with inner endwalls 166E-G that are not aligned. That is, each I/O opening 130E-G extends a different distance from exterior surface 132 into IC chip 101. Inner endwalls 166E-G are not in the same vertical plane.

As noted, moisture barrier 160 extends around edge 134 of IC chip 101. Referring to FIG. 1, in addition to opening(s) 150 described herein, another selected opening 150X may be in wall 140 such that it is aligned with moisture barrier 160 in edge 134 of IC chip 101, i.e., near an outer end of wall 140. Opening 150X may be filled with two moisture impervious dielectric material elements 162 (FIG. 2) with dielectric layer 164 (FIG. 2) therebetween, i.e., with the same arrangement as moisture barrier 160 extends around edge 134 of IC chip 101. Opening 150X is also shown but not labeled in FIG. 4-16. It will be recognized that selected opening 150X is optional.

Figure 15:
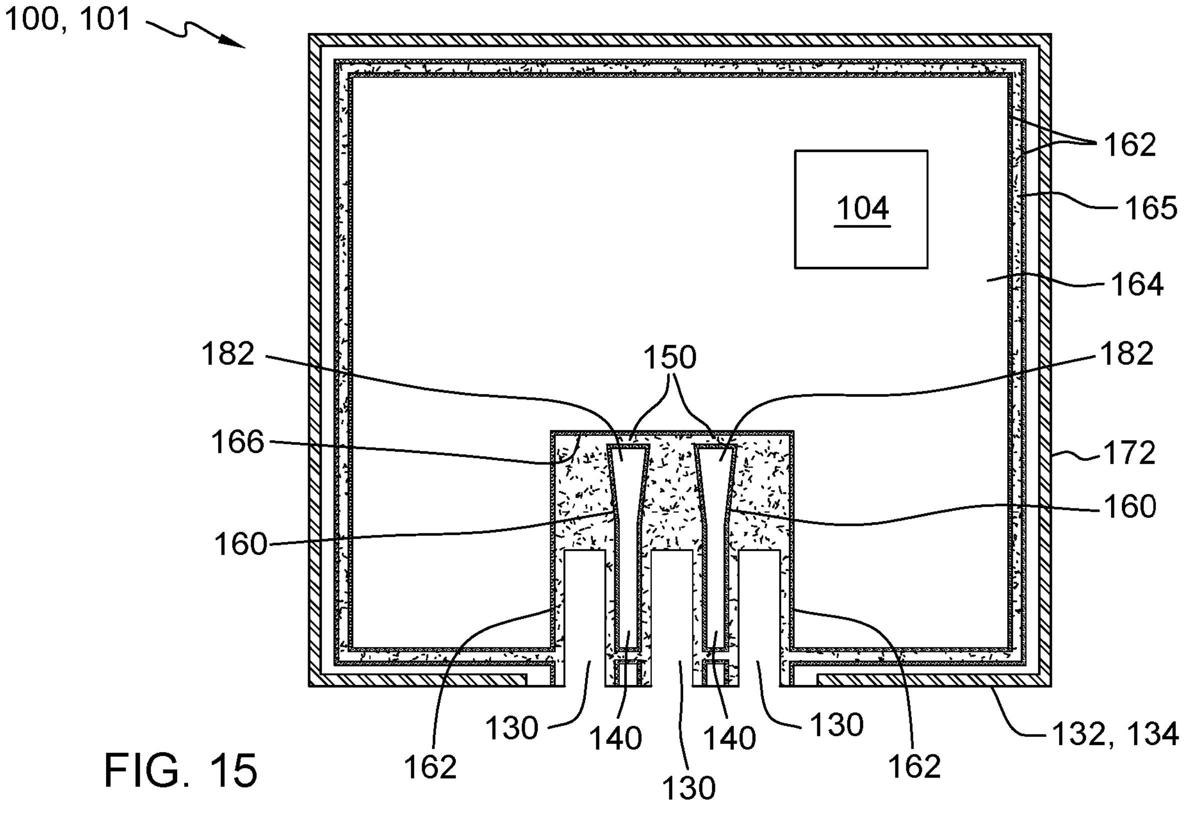
FIG. 15 shows a schematic top-down view of a structure and IC chip according to embodiments of the disclosure.
Figure 16:
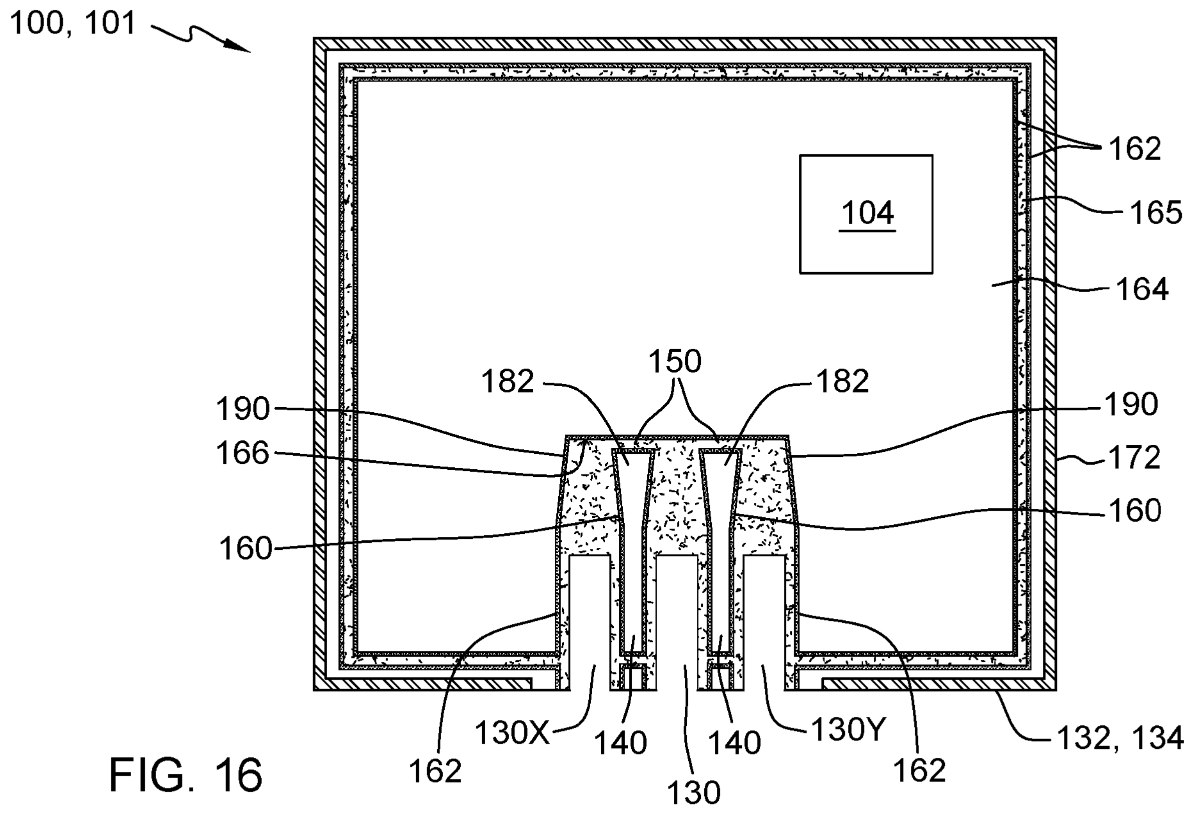
FIG. 16 shows a schematic top-down view of a structure and IC chip according to embodiments of the disclosure.

FIGS. 15 and 16 show schematic top-down views of other embodiments of structure 100. In FIGS. 15 and 16, inner end 182 of wall 140 has a trapezoidal lateral cross-section. That is, the width of wall 140 diverges to become laterally wider at inner end 182 thereof compared to a location closer to exterior surface 132 of IC chip 101. In this manner, inner end(s) 182 provide a more gradually changing surfaces within I/O openings 130. FIG. 16 shows another embodiment in which two laterally outward-most I/O openings 130X, 130Y of I/O openings 130 have converging sidewalls 190 adjacent to trapezoidal lateral cross-section of inner ends 182 of a respective wall 140 or respective walls 140 adjacent thereto. In this manner, inner ends 182 and I/O openings 130 adjacent thereto provide more gradually changing surfaces within I/O openings 130.

Figure 17:
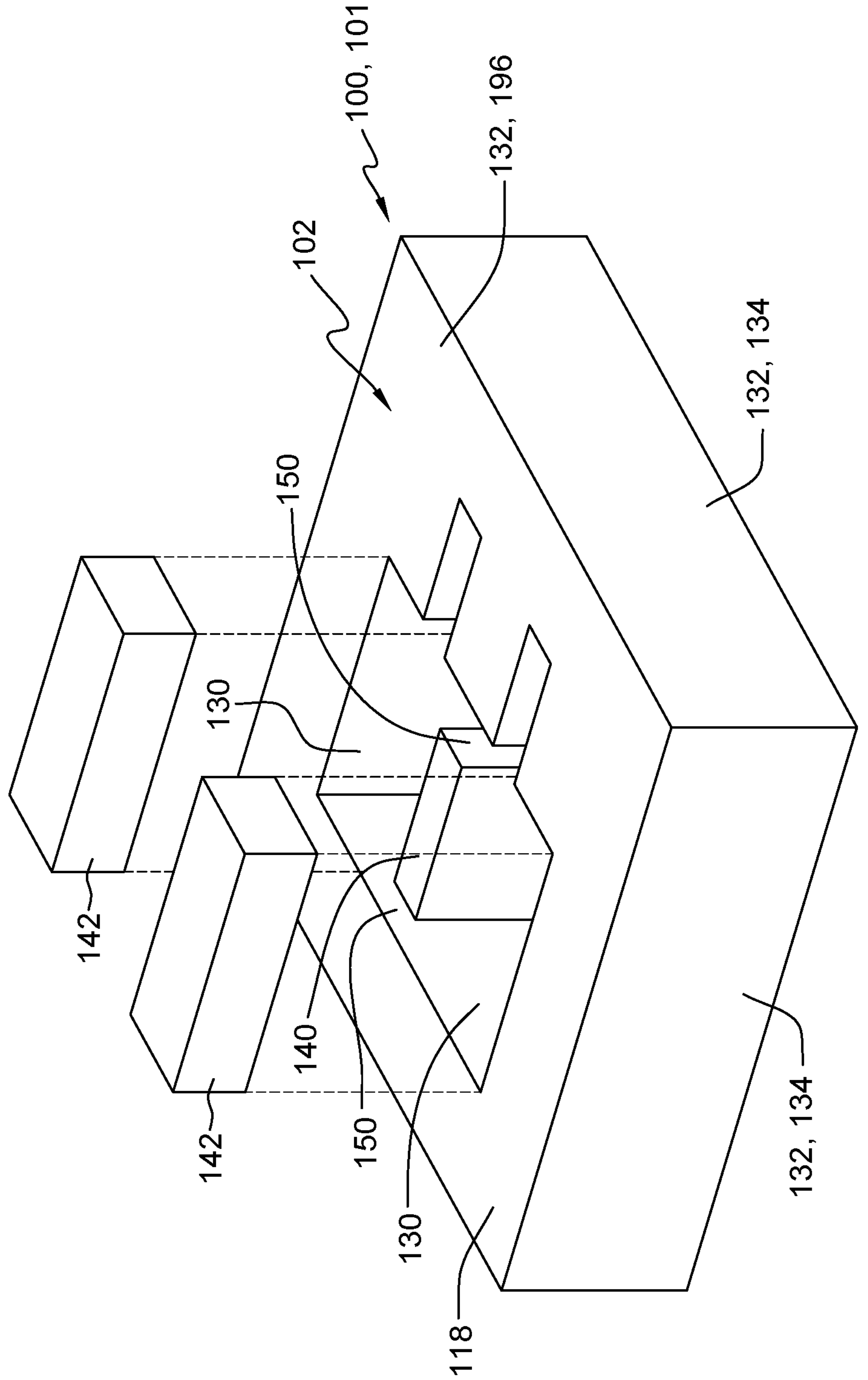
FIG. 17 shows a perspective view of a structure and IC chip and IC chip according to embodiments of the disclosure.
Figure 18:
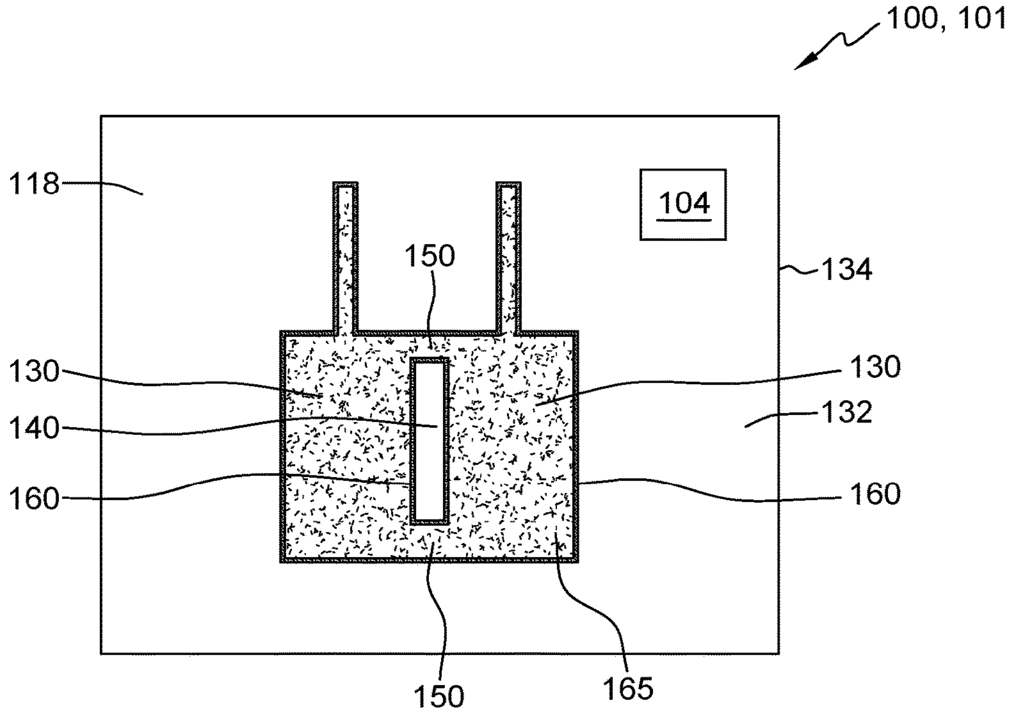
FIG. 18 shows a schematic top-down view of the structure and IC chip of FIG. 17.
Figure 19:
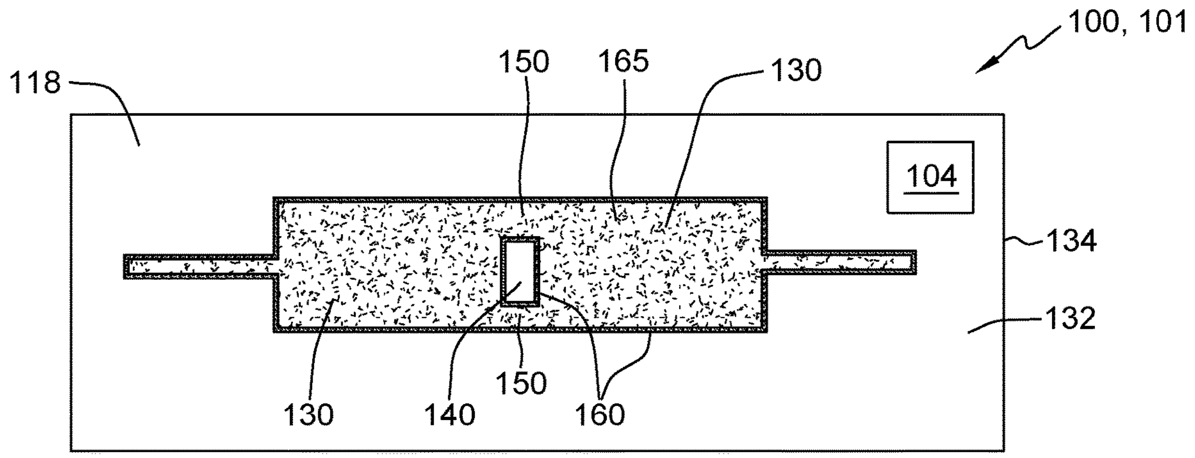
FIG. 19 shows a schematic top-down view of a structure and IC chip according to other embodiments of the disclosure.

FIGS. 17-19 show other embodiments of the disclosure in which exterior surface 132 includes a surface 196 of at least one BEOL interconnect layer 118 of IC chip 101, i.e., an upper outer surface of IC chip 101. As understood in the art, I/O openings 130 may also be positioned in surface 196 for coupling external (photonics or electronic) components 142. External components 142, such as an optical fiber, can connect to active circuitry 104 in any appropriate manner (not shown for clarity), e.g., electrical wires, optical waveguides, etc. FIG. 17 shows a perspective view of structure 100, FIG. 18 shows a schematic top-down view of FIG. 17 and FIG. 19 shows a schematic top-down view of another arrangement of I/O openings 130, according to embodiments of the disclosure. In these embodiments, I/O openings 130 extend vertically into surface 196 IC chip 101. Wall 140 in I/O openings 130 can include one or more openings 150 therein. In this example, external components 142 may include, for example, a laser. While two openings 150 are shown within walls 140, larger or smaller numbers of openings 150 may be employed. FIG. 18 shows an arrangement in which I/O openings 130 extend parallel to one another, and FIG. 19 shows an arrangement in which I/O openings 130 are end-to-end relative to one another. It will be recognized that the two arrangements shown in FIGS. 18 and 19 may be repeated for more than two I/O openings 130 and can be used together, if desired.

While particular embodiments of structure 100 have been illustrated and described herein, it is emphasized that the various embodiments and teachings of the disclosure can be combined in arrangements other than explicitly shown, i.e., parts of the illustrated embodiments can be used with other parts of the illustrated embodiments in ways not explicitly shown. While the illustrated embodiments show structure 100 with certain numbers of I/O openings 130, embodiments of the disclosure may include any number of I/O openings 130.

A method according to embodiments of the disclosure may include forming IC chip 101 including substrate 102 and forming at least two I/O opening(s) 130 extending inwardly from exterior surface 132 of IC chip 101. Each I/O opening 130 is separated from an adjacent I/O opening by wall 140 having opening 150 extending through wall 149 to each of the at least two I/O openings 130. The method may also include forming moisture barrier 160 on inner surfaces of each I/O opening 130 and opening 150. The above-described structures may be formed using any now known or later developed semiconductor fabrication processes.

Embodiments of the disclosure provide various technical and commercial advantages, examples of which are discussed herein. The structure improves IC chip moisture barrier robustness. As described, the opening may reduce film stresses in the I/O openings, reducing the likelihood of damage to the moisture barrier.

The structure and method as described above are used in the fabrication of integrated circuit chips and/or photonics integrated circuit chips. The resulting chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
- an integrated circuit (IC) chip including a substrate;
- at least two input/output (I/O) openings extending inwardly from an exterior surface of the IC chip, each I/O opening separated from an adjacent I/O opening by a wall;
- a through opening extending through the wall to each of the at least two I/O openings; and
- a moisture barrier on inner surfaces of each I/O opening and the through opening.

2. The structure of claim 1, wherein the at least two I/O openings include aligned inner endwalls.

3. The structure of claim 2, wherein the through opening extends through the wall at an end of the wall such that the inner endwalls of each I/O opening are contiguous.

4. The structure of claim 3, further comprising a recessed surface extending inwardly away from the wall between the inner endwalls of each I/O opening.

5. The structure of claim 2, wherein each I/O opening includes an inner endwall, and the through opening extends through the wall at a distance from the inner endwalls of the at least two I/O openings.

6. The structure of claim 1, wherein each I/O opening includes an inner endwall, and at least two of the inner endwalls are not aligned.

7. The structure of claim 1, wherein the through opening includes more than one opening in the wall, each opening spaced within the wall from an adjacent opening.

8. The structure of claim 1, wherein the moisture barrier extends around an edge of the IC chip, and a selected opening of the more than one opening is aligned with the moisture barrier in the edge of the IC chip.

9. The structure of claim 1, wherein the exterior surface includes an edge of the IC chip.

10. The structure of claim 1, wherein the exterior surface includes a surface of at least one back-end-of-line interconnect layer of the IC chip.

11. The structure of claim 1, wherein the moisture barrier is on a vertical sidewall surface of the wall.

12. The structure of claim 1, wherein the moisture barrier includes a silicon nitride layer, and each I/O opening and each opening includes a silicon oxide therein.

13. The structure of claim 1, wherein an inner end of the wall has a trapezoidal lateral cross-section.

14. The structure of claim 13, wherein two laterally outward-most I/O openings of the at least two I/O openings have converging sidewalls adjacent to the trapezoidal lateral cross-section of the inner ends of a respective wall or respective walls adjacent thereto.

15. A structure, comprising:
- an integrated circuit (IC) chip including a substrate;
- a first input/output (I/O) opening extending inwardly from an exterior surface of the IC chip;
- a second I/O opening extending inwardly from the exterior surface of IC chip and adjacent the first I/O opening, the first I/O opening separated from the second I/O opening by a wall;
- a through opening extending through the wall to the first I/O opening and the second I/O opening; and
- a moisture barrier on inner surfaces of the first I/O opening, the second I/O opening and the through opening.

16. The structure of claim 15, wherein the first I/O opening includes a first endwall and the second I/O opening includes a second endwall, the first endwall and the second endwall being contiguous.

17. The structure of claim 16, wherein the through opening extends through the wall at a distance from the first endwall of the first I/O opening and the second endwall of the second I/O opening.

18. The structure of claim 16, further comprising at least one third I/O opening extending inwardly from the exterior surface of IC chip and adjacent at least one of the first I/O opening and the second I/O opening, the third I/O opening separated from each respective adjacent I/O opening by a respective wall.

19. The structure of claim 15, wherein the through opening includes more than one opening, each opening spaced within the wall from an adjacent opening.

20. A method, comprising:

forming an integrated circuit (IC) chip including a substrate;

forming at least two input/output (I/O) openings extending inwardly from an exterior surface of the IC chip, each I/O opening separated from an adjacent I/O opening by a wall having a through opening extending through the wall to each of the at least two I/O openings; and forming a moisture barrier on inner surfaces of each I/O opening and the through opening.

* * * * *